(12) United States Patent
Chen et al.

(10) Patent No.: US 11,393,547 B2
(45) Date of Patent: Jul. 19, 2022

(54) ANTI-FUSE ONE-TIME PROGRAMMABLE MEMORY CELL AND RELATED ARRAY STRUCTURE

(71) Applicant: Piecemakers Technology, Inc., Hsinchu (TW)

(72) Inventors: Wei-Fan Chen, Taichung (TW); Chun-Peng Wu, Hsinchu (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 17/012,073

(22) Filed: Sep. 4, 2020

(65) Prior Publication Data

US 2021/0158881 A1 May 27, 2021

Related U.S. Application Data

(60) Provisional application No. 62/940,252, filed on Nov. 26, 2019.

(51) Int. Cl.
*G11C 17/16* (2006.01)
*H01L 27/112* (2006.01)

(52) U.S. Cl.
CPC ........ *G11C 17/16* (2013.01); *H01L 27/11206* (2013.01)

(58) Field of Classification Search
CPC .......................... G11C 17/16; H01L 27/11206
USPC .......................................................... 365/96
See application file for complete search history.

(56) References Cited

U.S. PATENT DOCUMENTS

| | | | |
|---|---|---|---|
| 9,105,310 B2 * | 8/2015 | Li | G11C 11/40 |
| 9,142,316 B2 | 9/2015 | Liu | |
| 2006/0132035 A1 * | 6/2006 | Sawai | H01J 29/862 |
| | | | 313/512 |
| 2006/0226509 A1 * | 10/2006 | Min | H01L 23/5252 |
| | | | 257/530 |
| 2007/0090417 A1 * | 4/2007 | Kudo | H01L 21/82385 |
| | | | 257/E21.624 |
| 2007/0207579 A1 * | 9/2007 | Omura | H01L 28/40 |
| | | | 438/149 |
| 2008/0283931 A1 * | 11/2008 | Wada | G11C 17/16 |
| | | | 257/E27.102 |
| 2016/0086961 A1 * | 3/2016 | Owada | H01L 27/11529 |
| | | | 438/258 |
| 2019/0080939 A1 * | 3/2019 | Ding | H01L 24/83 |

FOREIGN PATENT DOCUMENTS

CN 205861806 U * 1/2017

* cited by examiner

*Primary Examiner* — Muna A Techane
(74) *Attorney, Agent, or Firm* — Winston Hsu

(57) ABSTRACT

An one-time programmable memory cell includes: an upper electrode; an insulating layer beneath the upper electrode; and a lower electrode with electrical field enhancement structure beneath the insulating layer, wherein the electrical field enhancement structure has a least one tip portion. The one-time programmable memory cell also includes a shallow trench isolation region, disposed adjacent to the insulating layer and the lower electrode, wherein the electrical field enhancement structure is surrounded by the shallow trench isolation region and the upper electrode partially covers the shallow trench isolation region.

14 Claims, 5 Drawing Sheets

US 11,393,547 B2

ANTI-FUSE ONE-TIME PROGRAMMABLE MEMORY CELL AND RELATED ARRAY STRUCTURE

CROSS REFERENCE TO RELATED APPLICATIONS

This application claims the benefit of U.S. Provisional Application No. 62/940,252, filed on Nov. 26, 2019. The entire contents of the related application are incorporated herein by reference.

BACKGROUND OF THE INVENTION

1. Field of the Invention

The present invention relates anti-fuse elements, and more particularly, to one-time programmable (OTP) type anti-fuse devices with electrical field enhancement structures.

2. Description of the Prior Art

An anti-fuse element is a semiconductor device that changes its state from non-conductive to conductive. When an anti-fuse element is "fused," its open circuit state becomes shorted and conduction across electrodes of anti-fuse element becomes possible. Typically, the electrodes across the anti-fuse element is conducted by applying a sufficiently high voltage difference between electrodes of the anti-fuse element, thereby, breakdown the insulating layer (such as silicon dioxide) which located between an upper electrode and a lower electrode. As a result, the insulating material is turned into a shorted circuit state, thereby forming a conductive path between the upper and lower electrodes. Since the anti-fuse elements are alterable from conductive state to non-conductive state, it is usually used as memory devices to store the binary states. Anti-fuse memory is one type of one-time programmable (OTP) memory in which the cell can be permanently store information with program accordingly.

The existing anti-fuse memory technology has several problems, one of which is the wide-variation of conductivity of the programmed anti-fuse elements. This problem is mainly caused by the fact that the breakdown position of the insulting layer could vary based on many factors. As the breakdown position could be literally uncertain, it will bring the uncertainty of the conducted path and thus unfavorable effects to the reliability of the programmed information that stored in the OTP memory cell.

SUMMARY OF THE INVENTION

With this in mind, it is one object of the present invention to provide a novel anti-fuse one-time programmable memory (OTP) cell and an array structure thereof. Embodiments of the present invention provides local electrical field enhancement on the anti-fuse OTP memory cell based on electrical field enhancement structure, which provides a relative stronger electrical field than other portions of the whole structure. With the electrical field enhancement, the breakdown position of the insulting layer can be more concentrated. As a consequence, the data reliability that stored in the cell of programming OTP memory array can be improved.

According to one embodiment of the present invention, an one-time programmable (OTP) memory cell is provided. The OTP programmable memory cell comprises: an upper electrode; an insulating layer beneath the upper electrode; and a lower electrode with electrical field enhancement structure beneath the insulating layer, wherein the electrical field enhancement structure has a least one tip portion. The OTP memory cell also includes a shallow trench isolation region, disposed adjacent to the insulating layer and the lower electrode, wherein the electrical field enhancement structure is surrounded by the shallow trench isolation region and the upper electrode partially covers the shallow trench isolation region According to one embodiment of the present invention, an OTP programmable memory array is provided. The OTP memory array comprises: a plurality of the OTP memory cells with a shared upper electrode and a plurality of shallow trench isolation regions. Each of the OTP memory cells further comprises: an insulating layer beneath the shared upper electrode; and a lower electrode with electrical field enhancement structure beneath the insulating layer, wherein the electrical field enhancement structure has a least one tip portion. The shallow trench isolation regions are disposed between the OTP memory cells, wherein the electrical field enhancement structure of each OTP memory cell is surrounded by one of the shallow trench isolation regions.

According to one embodiment of the present invention, an OTP memory cell is provided. The OTP programmable memory cell comprises: an upper electrode with electrical field enhancement structure an insulating layer beneath the upper electrode; and a lower electrode beneath the insulating layer. The electrical field enhancement structure is formed by a first doped region and a second doped region of the upper electrode, and doping impurities of the first doped region is opposite in polarity to that of the second doped region.

These and other objectives of the present invention will no doubt become obvious to those of ordinary skill in the art after reading the following detailed description of the preferred embodiment that is illustrated in the various figures and drawings.

DETAILED DESCRIPTION

In the following description, several specific details are presented to provide a thorough understanding of the embodiments of the invention. One skilled in the relevant art will recognize, however, that the invention can be practiced without one or more of the specific details, or in combination with or with other components, etc. In other instances, well-known implementations or operations are not shown or described in detail to avoid obscuring aspects of various embodiments of the invention.

Reference throughout the specification to "one embodiment" or "an embodiment" means that a particular feature, structure, implementation, or characteristic described in connection with the embodiment is included in at least one embodiment of the present invention. Thus, uses of the phrases "in one embodiment" or "in an embodiment" in various places throughout the specification are not necessarily all referring to the same embodiment.

Figure 1:
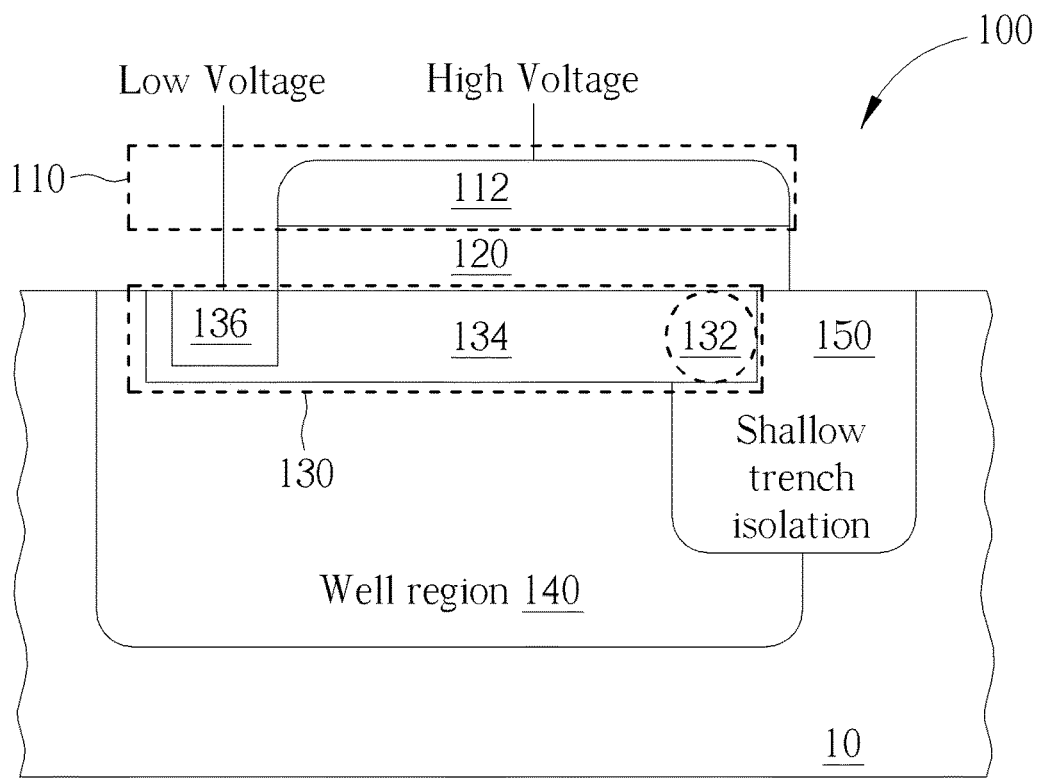
FIG. 1 illustrates a cross-sectional view of an anti-fuse OTP memory cell according to one embodiment of the present invention.
Figure 2:
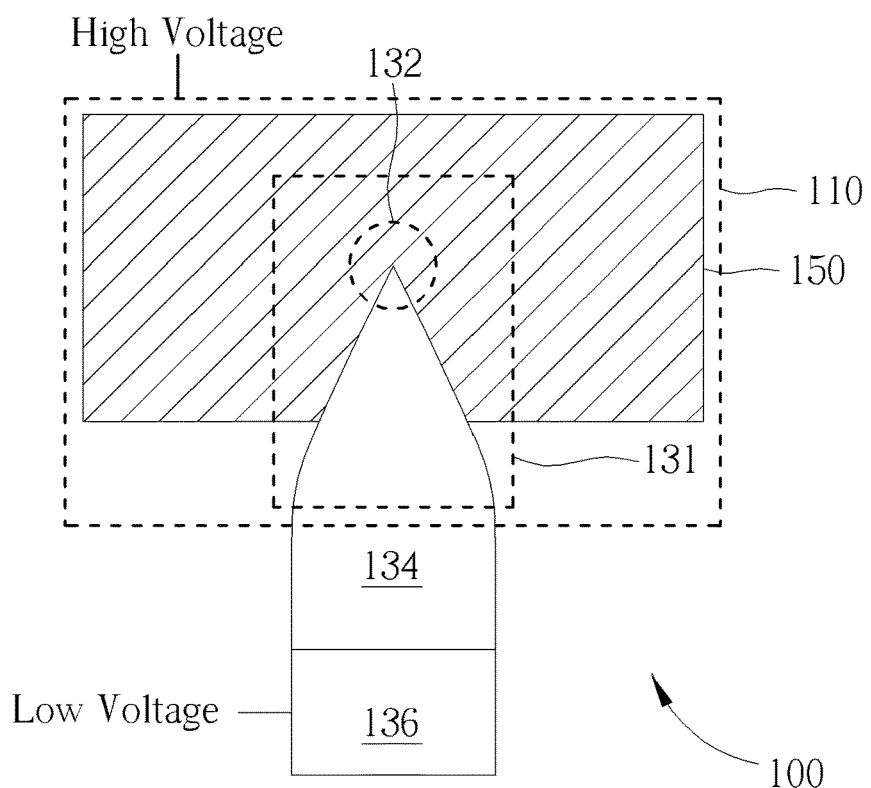
FIG. 2 illustrates a top view of an anti-fuse OTP memory cell according to one embodiment of the present invention.

Please refer to FIG. 1 and FIG. 2, which are a cross-sectional view and a top view of an anti-fuse one-time programmable (OTP) memory cell according to one embodiment of the present invention. As depicted, an anti-fuse OTP memory cell 100 comprises an upper electrode 110, an insulating layer 120, a lower electrode 130 and a well region 140. The upper electrode 110, the insulating layer and the lower electrode 130 are disposed in the well region 140 of a substrate 10. The insulating layer 120 is disposed beneath the upper electrode 110. The lower electrode 130 has electrical field enhancement structure 131 and is disposed beneath the insulating layer 120. Additionally, the electrical field enhancement structure 131 has a least one tip portion 132.

In one embodiment, the anti-fuse OTP memory cell 100 may further comprises: a shallow trench isolation region 150. The shallow trench isolation region 150 is adjacent to the insulating layer 120 and the lower electrode 130. As shown by a top view of the anti-fuse OTP memory cell 100 in FIG. 2, the tip portion 132 of the electrical field enhancement structure 131 is surrounded by the shallow trench isolation region 150. In addition, as shown by FIG. 1, the upper electrode 110 partially covers the shallow trench isolation region 150.

Referring to FIG. 1, the upper electrode 110 comprises a first doped region 112, and the doping impurities of the first doped region 112 is a first type of dopant polarity, e.g., the first doped region 112 is an N-type doped region. According to various embodiment of the present invention, the upper electrode 110 could be formed by polysilicon, metal, or a combination of polysilicon and metal. In addition, the material of the insulating layer 120 could be silicon oxide or other types of insulation materials.

The lower electrode 130 comprises: a second doped region 134 and a third doped region 136. The doping impurities of the second doped region 134 is also the first type of dopant polarity, e.g., an N-type doped region. The third doped region 136 is electrically connected to the second doped region 134, and the doping impurities of the third doped region 136 is identical in polarity to that of the second doped region 134. In addition, the doping impurities of the well region 140 is a second type of dopant polarity, e.g., the well region 140 may be a P-well region.

Figure 3C:
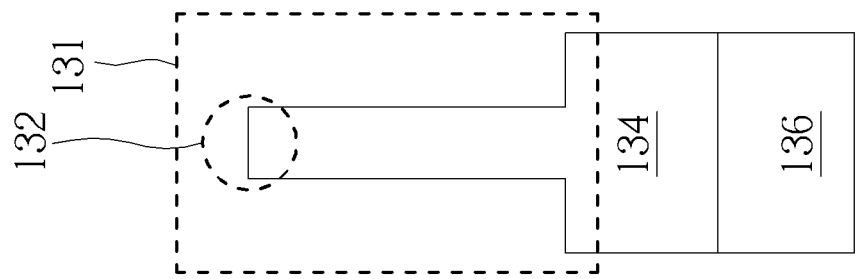
FIGS. 3A-3C illustrate the electrical field enhancement structure with different shapes according to various embodiments of the present invention.
Figure 3B:
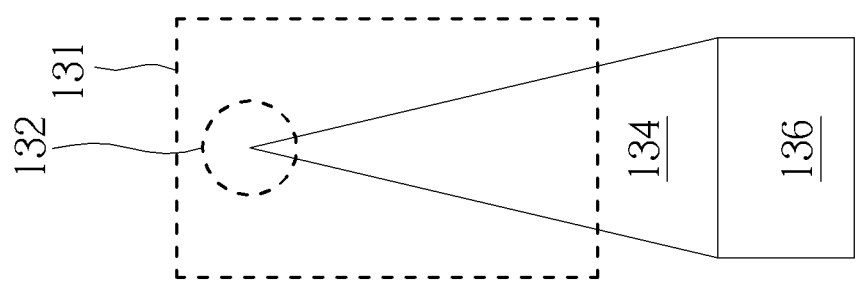
Figure 3A:
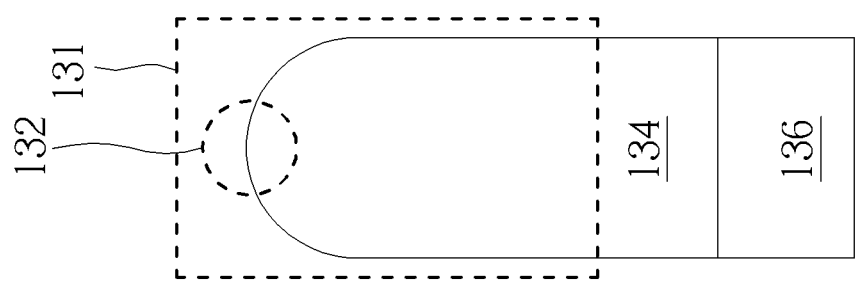

Please refer to FIGS. 3A-3C, which illustrates more details of the electrical field enhancement structure 131 according to various embodiments of the present invention. As illustrated, the electrical field enhancement structure 131 is formed by the second doped region 134. The second doped region 134 has a narrower end than another end that is connected to the third doped region 136, thereby to form the tip portion 132 of the electrical field enhancement structure 131. In one embodiment, the tip portion 132 of the electrical field enhancement structure 131 could have a radius of curvature that is smaller than 0.2 μm. According to the above embodiment, the shape of the tip portion 132 is not limited to a specific pattern.

As the tip portion 132 of the electrical field enhancement structure 131 is narrower than other portions of the second doped region 134 and the third doped region 136, an electrical field around the tip portion 131 would be relatively stronger than electrical field around other portions of the second doped region 134 and the third doped region 136.

During a programming operation on the anti-fuse OTP memory cell 100, the upper electrode 110 is electrically connected to a high voltage and the lower electrode 130 is electrically connected to a low voltage. Accordingly, a voltage difference will lead to the breakdown of the insulation layer 120, thereby to form a conducting path between the upper electrode 110 and the lower electrode 130. Accordingly, the anti-fuse OTP memory cell 100 is programmed to have a specific information state (e.g., bit "0"). As mentioned above, it is difficult to precisely control the breakdown location of the insulating layer 120 during the programming operation. The present invention relies on the electrical field enhancement structure 131 to overcome such problem. Due to the relatively stronger electrical field around the tip portion 132, the breakdown of the insulating layer 120 could be more concentrated on a certain region, forming a more solid conductive path, such that the variation in the conductivity could be alleviated. As a result, the programmed information state in the anti-fuse OTP memory cell 100 will be more reliable.

Figure 4:
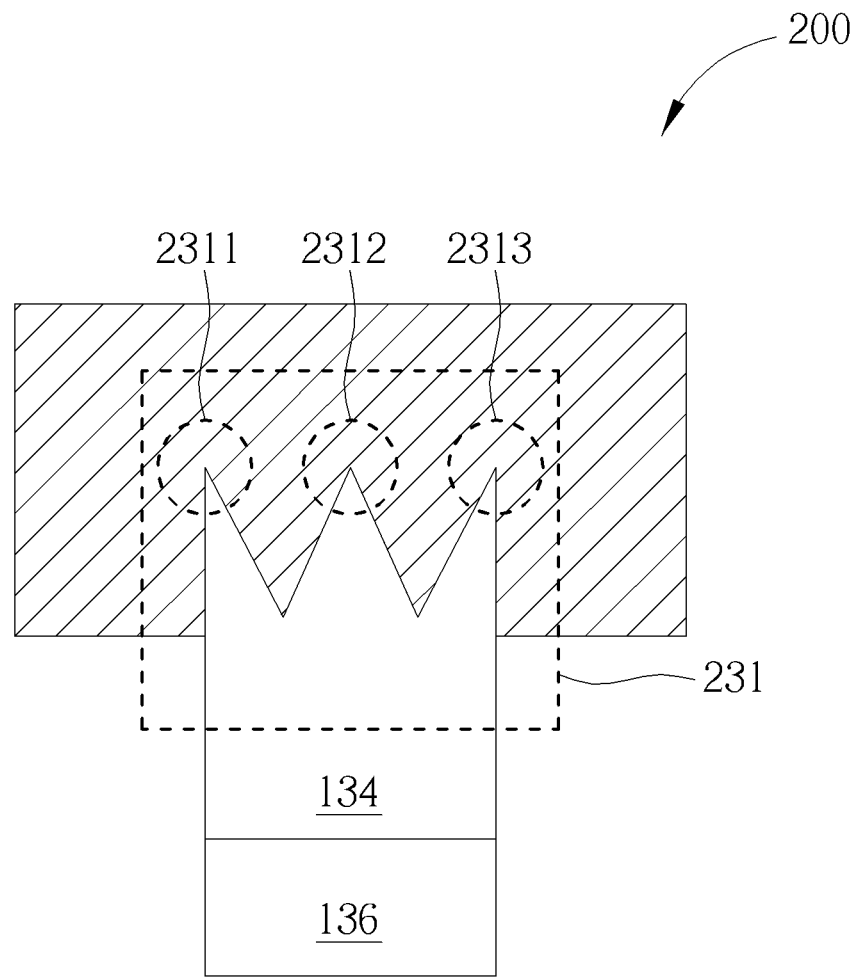
FIG. 4 illustrates a top view of an anti-fuse OTP memory cell according to one embodiment of the present invention.

Please refer to FIG. 4, which illustrates a top view of an anti-fuse OTP memory cell according to one embodiment of the present invention. In this embodiment, structure of an anti-fuse OTP memory cell 200 is substantially identical to that of the anti-fuse OTP memory cell 100 except electrical field enhancement structure 231. The electrical field enhancement structure 231 of the anti-fuse OTP memory cell 100 includes three tip portions 2311, 2312 and 2313, which provide relatively stronger electrical field there. From the above embodiments, it can be understood that the present invention is not limited in scope to the number of tip portions in one electrical field enhancement structure.

Figure 5A:
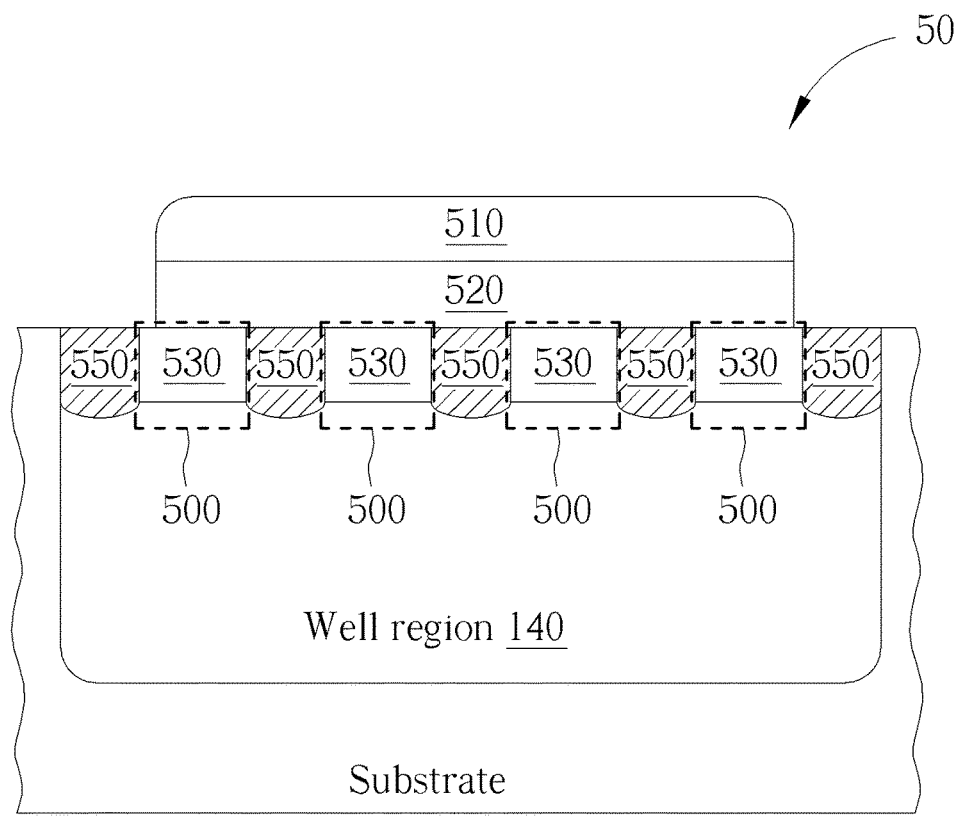
FIG. 5A illustrates a cross-sectional view of an anti-fuse OTP memory array according to one embodiment of the present invention.
Figure 5B:
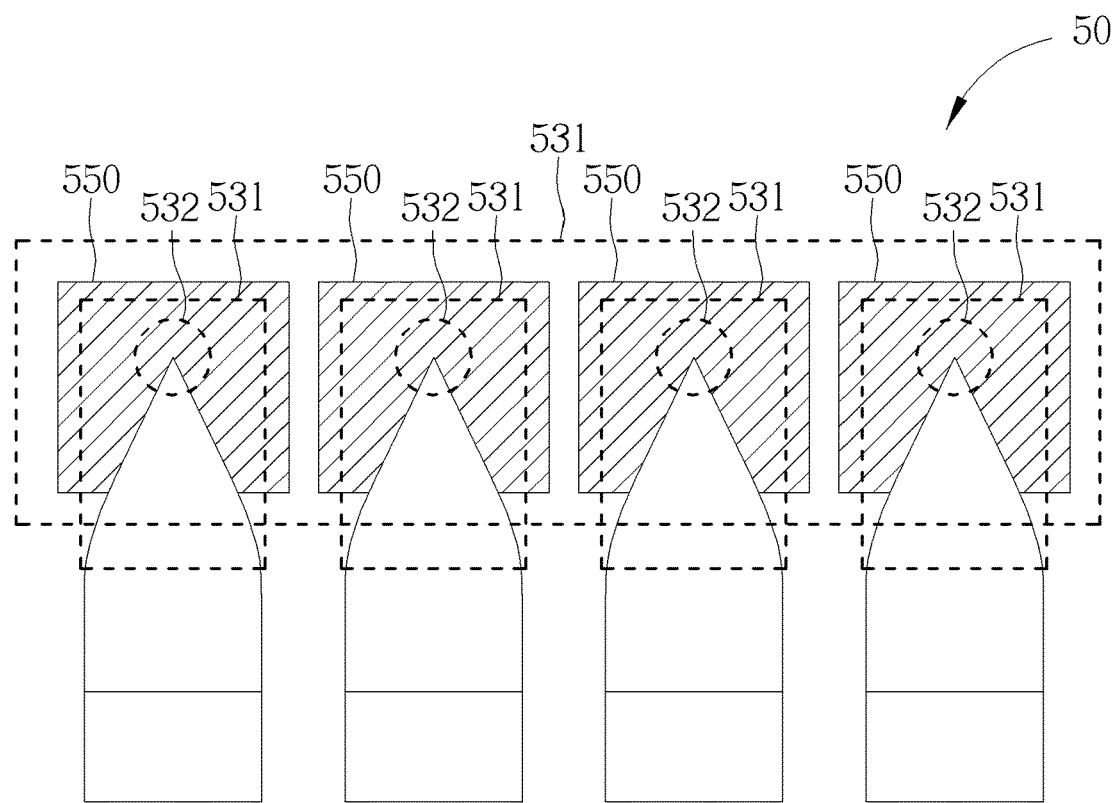
FIG. 5B illustrates a top view of an anti-fuse OTP memory array according to one embodiment of the present invention.

Please refer to FIG. 5A and FIG. 5B, which are a cross-sectional view and a top view of an anti-fuse one-time programmable (OTP) memory array based on according to one embodiment of the present invention. As depicted, an anti-fuse OTP memory array 50 comprises a plurality of anti-fuse OTP memory cells 500. The anti-fuse OTP memory cells 500 share a same shared upper electrode 510. Each anti-fuse OTP memory cells 500 comprises an insulating layer 520 beneath the shared upper electrode 510 and a lower electrode 530 with electrical field enhancement structure 531 beneath the insulating layer 520, wherein the electrical field enhancement structure 531 has a least one tip portion 532. In addition, the anti-fuse OTP memory array 50 comprises a plurality of shallow trench isolation regions 550. The shallow trench isolation regions 550 are disposed between the OTP memory cells 500, wherein the electrical field enhancement structure 531 of each OTP memory cell 500 is surrounded by one of the shallow trench isolation regions 550. Intended purpose of the shallow trench isolation regions 550 is to isolate each of the anti-fuse OTP memory cells 500, thereby to prevent any unwanted cross-interference. Except the shared upper electrode 510, each anti-fuse OTP memory cell 500 is identical in structure to the anti-fuse OTP memory cell 100. Therefore, detailed descriptions and explanations regarding the structure of the OTP memory cell 500 are omitted here for the sake of brevity.

Figure 6:
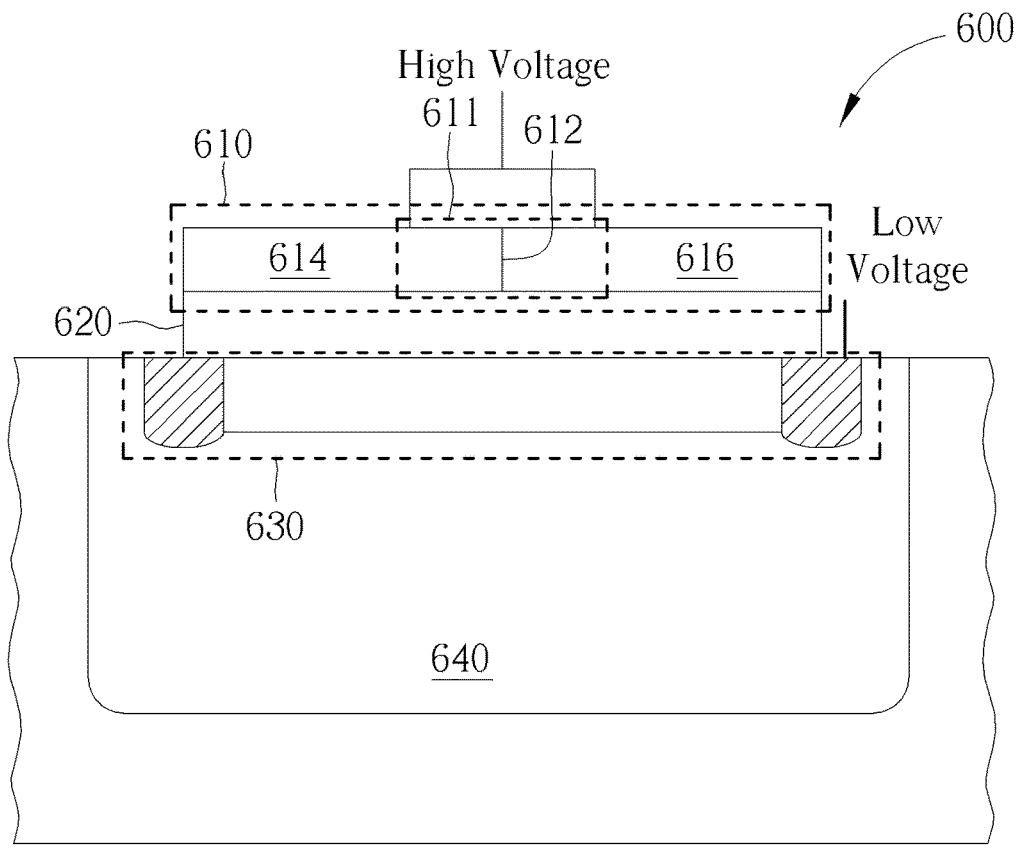
FIG. 6 illustrates a top view of an anti-fuse OTP memory cell according to one embodiment of the present invention.
Figure 7:
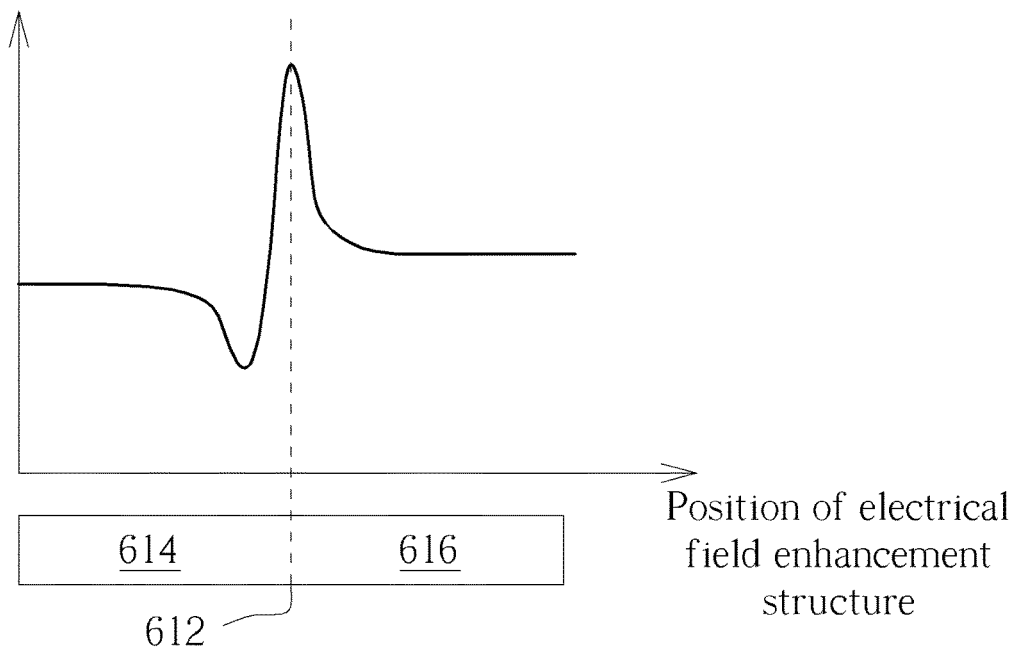
FIG. 7 illustrates a diagram of electrical field intensity with respect to positions of an upper electrode of the anti-fuse OTP memory of FIG. 6.

Please refer to FIG. 6, which is a cross-sectional view of an anti-fuse one-time programmable (OTP) memory cell according to one embodiment of the present invention. As depicted, an anti-fuse OTP memory cell 600 comprises an upper electrode 610, an insulating layer 620, a lower electrode 630 and a well 640. The upper electrode 610, the insulating layer 60 and the lower electrode 630 is disposed in the well region 640 of a substrate 60. The insulating layer 620 is disposed beneath the upper electrode 610 and the lower electrode 630 is disposed beneath the insulating layer 620. In this embodiment, the upper electrode 610 has electrical field enhancement structure 611. The electrical field enhancement structure 611 is formed by a first doped region 614 and a second doped region 616 of the upper electrode 610. The doping impurities of the first doped region 614 is opposite in polarity to that of the second doped region 616. For example, the first doped region 614 may be a N-type doped region, while the second doped region may be a P-type doped region, or vice versa. During a programming operation on the anti-fuse OTP memory cell 600, the upper electrode 610 is electrically connected to a high voltage and the lower electrode 630 is electrically connected to a low voltage. At this moment, there will be a relative stronger electrical field produced around a junction 612 of the first doped region 614 and the second doped region 616. Such stronger electrical field is produced due to discontinuity of doping impurities. Please refer to FIG. 7, which illustrates a plot of an intensity of the electrical field over positions of the electrical field enhancement structure 611. Due to polysilicon depletion effect, there will be a stronger electrical field around the first doped region 614 (e.g. N-type doped region) and a weaker electrical field around the second doped region 616 (e.g. P-type doped region). Due to the continuity equation, there will be thus a peak in the intensity of the electrical field around the junction 612 of the first doped region 614 and the second doped region 616 since the intensity of the electrical field must be continuous over the upper electrode 610. As a consequence, the electrical field enhancement structure 611 provides a relatively stronger electrical field around the junction 612, such that the breakdown position of the insulting layer 620 could be more concentrated.

In conclusion, a novel anti-fuse OTP memory cell with electric field enhancement structure is provided. The electric field enhancement structure can more precisely control the breakdown position of the insulting layer, thereby to reduce the variation in the conductivity of the memory cell, such that the programmed information in the memory cell 100 will be more reliable.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An one-time programmable (OTP) memory cell, comprising:
    an upper electrode;
    an insulating layer beneath the upper electrode; and
    a lower electrode with electrical field enhancement structure beneath the insulating layer, wherein the electrical field enhancement structure has a least one tip portion, and a dopant polarity of doping impurities of the electrical field enhancement structure is identical to that of the lower electrode; and
    a shallow trench isolation region, disposed adjacent to the insulating layer and the lower electrode, wherein the electrical field enhancement structure is surrounded by the shallow trench isolation region and the upper electrode partially covers the shallow trench isolation region.

2. The OTP memory cell of claim 1, wherein the upper electrode comprises:
    a first doped region, wherein doping impurities of the first doped region is a first type of dopant polarity.

3. The OTP memory cell of claim 1, wherein the lower electrode comprises:
    a second doped region, wherein doping impurities of the second doped region is the first type of dopant polarity;
    a third doped region, electrically connected to the second doped region, wherein doping impurities of the third doped region is the first type of dopant polarity;
    wherein the electrical field enhancement structure is formed by the second doped region and covered by the first doped region.

4. The OTP memory cell of claim 3, wherein the tip portion of the electrical field enhancement structure generates an electrical field that is relatively stronger than electrical fields generated by the third doped region.

5. The OTP memory cell of claim 1, wherein the tip portion of the electrical field enhancement structure has a radius of curvature that is smaller than 0.2 μm.

6. The OTP memory cell of claim 1, wherein the upper electrode is electrically connected to a high voltage and the lower electrode is electrically connected to a low voltage during a programming operation.

7. The OTP memory unit of claim 1, further comprising:
    a fourth doped region, wherein doping impurities of the fourth doped region is a second type of dopant polarity, wherein the second doped region and the third doped region is disposed in the fourth doped region.

8. An one-time programmable (OTP) memory array, comprising:
    a plurality of the OTP memory cells with a shared upper electrode, each of the OTP memory cells further comprising:
        an insulating layer beneath the shared upper electrode; and
        a lower electrode with electrical field enhancement structure beneath the insulating layer, wherein the electrical field enhancement structure has a least one tip portion, and a dopant polarity of doping impurities of the electrical field enhancement structure is identical to that of the lower electrode; and
    a plurality of shallow trench isolation regions, disposed between the OTP memory cells, wherein the electrical field enhancement structure of each OTP memory cell is surrounded by one of the shallow trench isolation regions.

9. The OTP memory array of claim 8, wherein the shared upper electrode comprises:
    a first doped region, wherein doping impurities of the first doped region is a first type of dopant polarity.

10. The OTP memory array of claim 8, wherein the lower electrode of each OTP memory cell comprises:
    a second doped region, wherein doping impurities of the second doped region is the first type of dopant polarity;
    a third doped region, electrically connected to the second doped region, wherein doping impurities of the third doped region is the first type of dopant polarity;

wherein the electrical field enhancement structure is formed by the second doped region and covered by the first doped region of the shared upper electrode.

11. The OTP memory array of claim 10, wherein the tip portion of the electrical field enhancement structure generates an electrical field that is relatively stronger than electrical fields generated by the third doped region.

12. The OTP memory array of claim 8, wherein the tip portion of the electrical field enhancement structure has a radius of curvature that is smaller than 0.2 μm.

13. The OTP memory array of claim 8, wherein the shared upper electrode is electrically connected to a high voltage and the lower electrode is electrically connected to a low voltage during a programming operation.

14. The OTP memory array of claim 8, wherein each OTP memory cell further comprising:
   a fourth doped region, wherein doping impurities of the fourth doped region is a first type of dopant polarity, wherein the second doped region and the third doped region is disposed in the fourth doped region.

* * * * *